(12) United States Patent
Yamartino et al.

(10) Patent No.: US 6,673,199 B1
(45) Date of Patent: Jan. 6, 2004

(54) SHAPING A PLASMA WITH A MAGNETIC FIELD TO CONTROL ETCH RATE UNIFORMITY

(75) Inventors: John M. Yamartino, Palo Alto, CA (US); Peter K. Loewenhardt, Pleasanton, CA (US); Dmitry Lubomirsky, Cupertino, CA (US); Saravjeet Singh, Santa Clara, CA (US)

(73) Assignee: Applied Materials, Inc., Santa Clara, CA (US)

(*) Notice: Subject to any disclaimer, the term of this patent is extended or adjusted under 35 U.S.C. 154(b) by 69 days.

(21) Appl. No.: 09/800,876

(22) Filed: Mar. 7, 2001

(51) Int. Cl.⁷ .......................... H05H 1/00; C23C 16/00; H01L 21/00

(52) U.S. Cl. .................. 156/345.49; 156/345.46; 118/723 I; 118/723 E; 118/723 MA; 118/723 MR; 438/732; 438/728

(58) Field of Search ................ 156/345.49, 345.46; 204/298.37; 118/723 MA, 723 MR, 723 I, 723 E, 723 MN; 216/68; 438/732, 729, 728

(56) References Cited

U.S. PATENT DOCUMENTS

| | | |
|---|---|---|
| 3,170,383 A | 2/1965 | Hunt |
| 3,316,468 A | 4/1967 | Hanks |
| 3,514,391 A | 5/1970 | Hablanian et al. |
| 4,037,945 A | 7/1977 | Wollam |
| 4,198,261 A | 4/1980 | Busta et al. |
| 4,208,240 A | 6/1980 | Latos |
| 4,493,745 A | 1/1985 | Chen et al. |
| 4,842,683 A | 6/1989 | Cheng et al. |
| 4,859,277 A | 8/1989 | Barna et al. |
| 4,913,928 A | 4/1990 | Sugita et al. |
| 4,953,982 A | 9/1990 | Ebbing et al. |
| 4,975,141 A | 12/1990 | Greco et al. |
| 4,990,229 A | 2/1991 | Campbell et al. |
| 5,002,631 A | 3/1991 | Giapis et al. |

(List continued on next page.)

FOREIGN PATENT DOCUMENTS

| | | |
|---|---|---|
| EP | 0607797 | 7/1994 |
| EP | 0735565 | 2/1996 |
| EP | 0756318 | 1/1997 |
| EP | 0788138 | 8/1997 |
| EP | 0801413 | 10/1997 |
| EP | 0908922 | 4/1999 |
| JP | 61160926 | 7/1986 |
| JP | 03015198 | 1/1991 |
| JP | 63253617 | 10/1998 |
| WO | WO9844535 | 10/1998 |
| WO | WO9848444 | 10/1998 |
| WO | WO9914791 | 3/1999 |

OTHER PUBLICATIONS

Stevens, et al "Helicon plasma source excited by a flat spiral coil", *J. Vac. Sci. Technol A*, 13(5), Sep./Oct. 1995, pp. 2476–2482.

PCT Search Report dated Sep. 15, 1999, European Patent Office, P B. 5818 Patentian 2 NL–2280 HV Rijswijk.

(List continued on next page.)

*Primary Examiner*—Parviz Hassanzadez
(74) *Attorney, Agent, or Firm*—Ashok K Janah; Joseph Bach

(57) ABSTRACT

A substrate etching chamber has a substrate support, a gas supply to introduce a process gas into the chamber; an inductor antenna to sustain a plasma of the process gas in a process zone of the chamber, and an exhaust to exhaust the process gas. A magnetic field generator disposed about the chamber has first and second solenoids. A controller is adapted to control a power supply to provide a first current to the first solenoid and a second current to the second solenoid, thereby generating a magnetic field in the process zone of the chamber to controllably shape the plasma in the process zone to reduce etch rate variations across the substrate.

39 Claims, 9 Drawing Sheets

U.S. PATENT DOCUMENTS

| | | | |
|---|---|---|---|
| 5,074,985 A | 12/1991 | Tamura et al. | |
| 5,122,251 A | 6/1992 | Campbell et al. | |
| 5,129,994 A | 7/1992 | Ebbing et al. | |
| 5,146,137 A | 9/1992 | Gesche et al. | |
| 5,200,023 A | 4/1993 | Gifford et al. | |
| 5,225,740 A | 7/1993 | Ohkawa | |
| 5,277,746 A | 1/1994 | Anderson | |
| 5,290,383 A | 3/1994 | Koshimizu | |
| 5,308,414 A | 5/1994 | O'neil et al. | |
| 5,344,536 A * | 9/1994 | Obuchi et al. | 204/192.32 |
| 5,361,016 A | 11/1994 | Ohkawa et al. | |
| 5,362,356 A | 11/1994 | Schoenborn | |
| 5,370,765 A | 12/1994 | Dandl | |
| 5,372,673 A | 12/1994 | Stager et al. | |
| 5,392,124 A | 2/1995 | Barbee et al. | |
| 5,399,229 A | 3/1995 | Stefani et al. | |
| 5,403,433 A | 4/1995 | Morrison et al. | |
| 5,406,080 A | 4/1995 | Friedhelm | |
| 5,421,891 A | 6/1995 | Campbell et al. | |
| 5,429,070 A * | 7/1995 | Campbell et al. | 118/723 MP |
| 5,430,355 A | 7/1995 | Paranjpe | |
| 5,445,705 A | 8/1995 | Barbee et al. | |
| 5,450,205 A | 9/1995 | Sawin et al. | |
| 5,451,289 A | 9/1995 | Barbee et al. | |
| 5,456,788 A | 10/1995 | Barbee et al. | |
| 5,467,883 A | 11/1995 | Frye et al. | |
| 5,468,341 A | 11/1995 | Samukawa | |
| 5,472,508 A | 12/1995 | Saxena | |
| 5,531,862 A | 7/1996 | Otsubo et al. | |
| 5,536,359 A | 7/1996 | Kawada et al. | |
| 5,567,268 A | 10/1996 | Kadomura | |
| 5,587,038 A | 12/1996 | Cechhi et al. | |
| 5,622,635 A | 4/1997 | Cuomo et al. | |
| 5,648,701 A | 7/1997 | Hooke et al. | |
| 5,654,903 A | 8/1997 | Reitman et al. | |
| 5,662,819 A | 9/1997 | Kadomura | |
| 5,669,975 A | 9/1997 | Ashtiani | |
| 5,674,321 A | 10/1997 | Pu et al. | |
| 5,686,796 A | 11/1997 | Boswell et al. | |
| 5,691,540 A | 11/1997 | Halle et al. | |
| 5,716,451 A | 2/1998 | Hama et al. | |
| 5,738,756 A | 4/1998 | Liu | |
| 5,747,380 A | 5/1998 | Yu et al. | |
| 5,748,297 A | 5/1998 | Suk et al. | |
| 5,753,044 A | 5/1998 | Hanawa et al. | |
| 5,767,628 A | 6/1998 | Keller et al. | |
| 5,770,097 A | 6/1998 | O'Neill et al. | |
| 5,772,772 A | 6/1998 | Chi | |
| 5,792,272 A | 8/1998 | Van Os et al. | |
| 5,800,619 A | 9/1998 | Holland et al. | |
| 5,800,688 A | 9/1998 | Lantsman et al. | |
| 5,804,046 A | 9/1998 | Sawada et al. | |
| 5,807,761 A | 9/1998 | Coronel et al. | |
| 5,824,602 A | 10/1998 | Molvik et al. | |
| 5,834,375 A | 11/1998 | Chen | |
| 5,837,057 A | 11/1998 | Koyama et al. | |
| 5,846,883 A | 12/1998 | Moslehi | |
| 5,858,259 A | 1/1999 | Hirose et al. | |
| 5,874,704 A | 2/1999 | Gates | |
| 5,907,677 A | 5/1999 | Glenn et al. | |
| 5,975,013 A | 11/1999 | Holland et al. | |
| 5,983,828 A | 11/1999 | Savas | |
| 6,006,694 A | 12/1999 | DeOrnellas et al. | |
| 6,028,286 A | 2/2000 | Wicker et al. | |
| 6,085,688 A | 7/2000 | Lymberopoulos et al. | |
| 6,300,227 B1 * | 10/2001 | Liu et al. | 438/513 |

OTHER PUBLICATIONS

International Search Report, dated Feb. 17, 1999, Euorpean Patent Office, P.B. 5818 Patentiaan 2 NL–2280 JV Rijswijk.

Principals of Instrumental Analysis, $2^{nd}$ Ed., Skoog and West (Saunders, 1980) pp. 181, 182, 193, 245.

Sofie Instruments– Product User's Manual, Digitwin, Publication date unknown.

"In–Situ Control and Diagnosis of Depositionand Etch Processes is Possible Using Interferometry Combined with CCD Imaging," European Semiconductor, Mar. 1995, pp. 14–17.

F. Heinrich, P. Kooperschmidt, "Online Uniformity Measurements in Large Area Plasma Assisted Etching and Deposition", Proceedings of the $10^{th}$ International Colloquium on Plasma Processes CIP 95, Antibes, France, Jun. 11–15, 1995.

U.S. Patent Application entitled, "Apparatus for Monitoring Process of a Substrate", filed Oct. 6, 1997, Serial No. 08/944,240; Inventors: Grimbergen, et al.

* cited by examiner

& # x 2 0 ;

SHAPING A PLASMA WITH A MAGNETIC FIELD TO CONTROL ETCH RATE UNIFORMITY

BACKGROUND

Embodiments of the present invention relate to the plasma etching of a substrate.

In the fabrication of electronic components and circuitry, a plasma of a process gas may be used to process semiconductor, dielectric and conductor materials, such as for example, silicon, silicon dioxide, and metal-containing layers, on a substrate. The substrate may be a semiconductor wafer or dielectric material. The substrate materials are typically formed by chemical vapor deposition (CVD), physical vapor deposition (PVD), oxidation or nitridation processes. In a typical CVD process, a plasma is provided in the chamber to deposit material on the substrate. In a typical PVD process, a target facing the substrate is sputtered to deposit target material on the substrate. The substrate is then etched by forming a patterned etch-resistant material, such as resist or hard mask, on the substrate, and etching exposed portions of the substrate by a plasma to form features such as gates, vias, contact holes and interconnect lines, in the substrate. The plasma may also be used in other substrate fabrication processes, such as post-etch treatments and in chamber cleaning processes.

However, conventional plasma processes often fail to provide good etch rate uniformity across the substrate. For example, in etching processes, the peripheral edge of the substrate may often be etched at faster etching rates than the central portion of the substrate. The non-uniform etching rates may arise from a non-uniform distribution of energized plasma species across the substrate, temperature variations, or other factors. It is difficult to control the etching process to obtain uniform etching rates across the surface of the entire substrate.

Thus it is desirable to be able to generate and control a plasma to etch a substrate with good etch rate uniformity across the substrate.

SUMMARY

A substrate etching chamber comprises a substrate support to support a substrate in a process zone, a gas supply to introduce a process gas into the process zone, an inductor antenna to inductively couple energy to the process gas to form a plasma of the process gas in the process zone, a magnetic field generator to generate a magnetic field in the process zone, the magnetic field generator comprising first and second solenoids disposed about the process zone and a power supply to power the solenoids, a controller adapted to control the power supply of the magnetic field generator to pass a first current through the first solenoid and pass a second current through the second solenoid, the second current being in the opposite direction of the first current, and an exhaust to exhaust the process gas.

In another aspect, a substrate etching method comprises placing a substrate in a process zone, introducing a process gas into the process zone, inductively coupling energy to the process gas to form a plasma in the process zone, generating a magnetic field in the process zone by providing a first current to a first solenoid and a second current to a second solenoid, the first current being in the opposite direction to the second current, and exhausting the process gas from the process zone.

In yet another aspect, the substrate etching chamber comprises a substrate support to support a substrate in a process zone, a gas supply to introduce a process gas into the process zone, a gas energizer comprising an inductor antenna to inductively couple energy to the process gas to form a plasma of the process gas in the process zone and an RF power supply to pass an RF current through the inductor antenna, a magnetic field generator to generate a controllable magnetic field in the process zone, the magnetic field generator comprising first and second solenoids disposed about the process zone and a DC power supply to pass direct current through the first and second solenoids, and an exhaust to exhaust the process gas.

In yet another aspect, the substrate etching method comprises placing a substrate in a process zone, introducing a process gas into the process zone, inductively coupling energy to the process gas to form a plasma in the process zone by providing RF current to an inductor coil, generating a magnetic field in the process zone by providing direct current to first and second solenoids, and exhausting the process gas from the process zone.

DRAWINGS

These features, aspects, and advantages of the present invention will become better understood with regard to the following description, appended claims, and accompanying drawings which illustrate exemplary features of the invention. However, it is to be understood that each of the features can be used in the invention in general, not merely in the context of the particular drawings, and the invention includes any combination of these features, where:

DESCRIPTION

Figure 1:
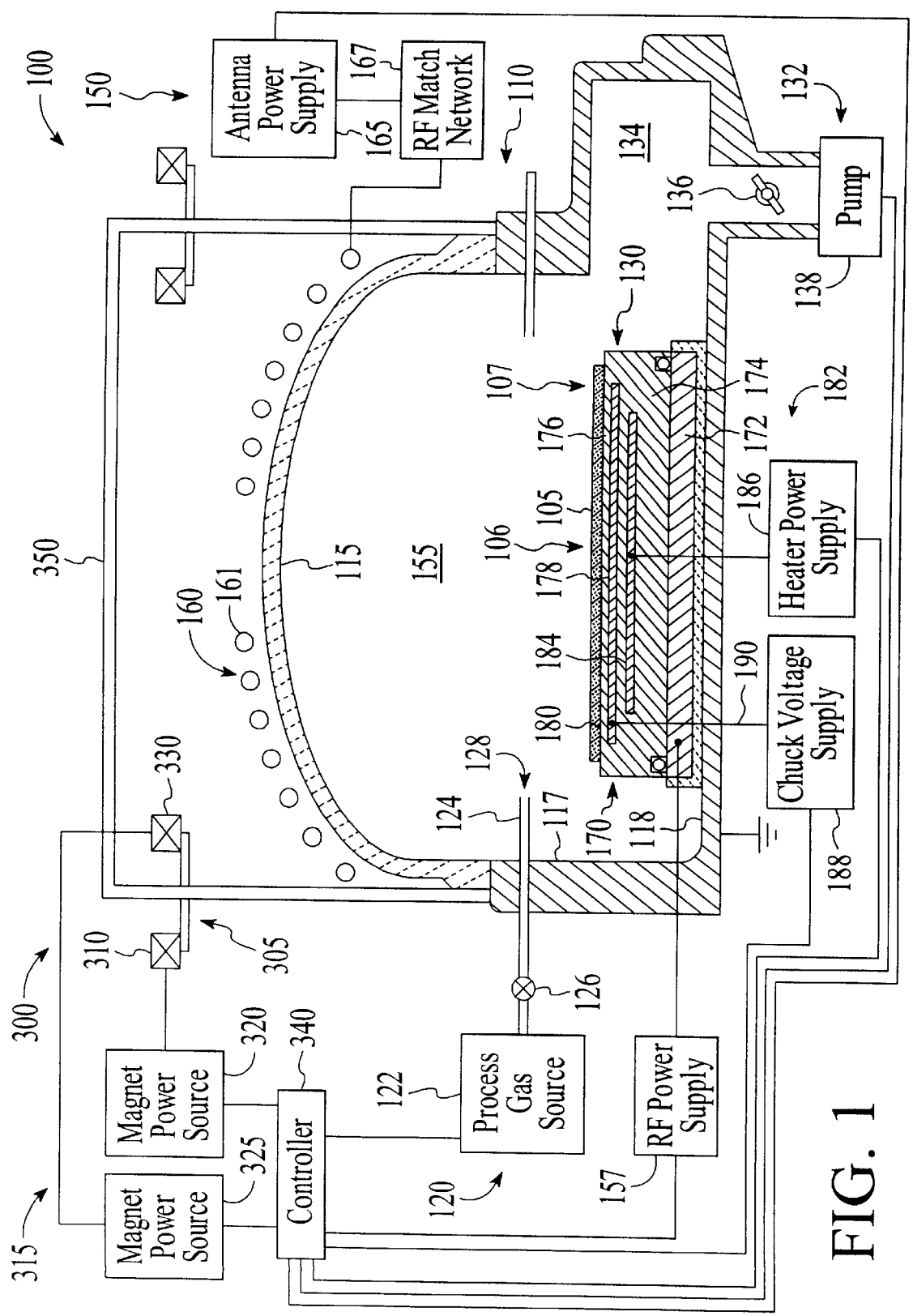
FIG. 1 is a schematic sectional view of a version of a process chamber and magnetic field generator according to the present invention.

The present invention is useful for fabricating electronic circuitry on a substrate by etching materials, such as silicon-containing, metal-containing, dielectric, and/or conductor materials. An embodiment of an apparatus 100 suitable for etching substrates 105, such as semiconductor wafers, is illustrated in FIG. 1. The apparatus 100 comprises a process chamber 110 that may be attached to a mainframe unit that provides electrical, plumbing, and other support functions for the chamber 110. The apparatus 100 is provided only to illustrate the invention, and should not be used to limit the scope of the present invention, or the equivalents of the present invention, to the exemplary embodiments provided herein. Generally, the apparatus 100 comprises a chamber 110 defined by a ceiling 115, sidewalls 117, and a bottom wall 118, and which is typically fabricated from metal or ceramic materials. Metals commonly used to fabricate the chamber 110 include aluminum, anodized aluminum, "HAYNES 242," "Al-6061," "SS 304," "SS 316," and INCONEL, of which anodized aluminum is often used. The ceiling 115 may comprise a substantially arcuate portion, or in other versions, the ceiling 115 may comprise a substantially flat or multi-radius domed shaped portion. The chamber 110 typically comprises a process zone 155 into which process gas is introduced through a gas supply 120. The gas supply 120 includes a process gas source 122, conduits 124 with flow control valves 126, and gas outlets 128 around a periphery of the substrate 105 which may be held on a substrate support 130. Spent process gas and etchant byproducts are exhausted from the chamber 110 through an exhaust system 132, which includes a pumping channel 134 that receives spent process gas, a throttle valve 136 to control the pressure of process gas in the chamber 110, and one or more exhaust pumps 138.

The process gas may be energized to sustain a plasma to process the substrate 105 by a gas energizer 150 that couples energy to the process gas in the process zone 155 of the chamber 110. In one version, the gas energizer 150 comprises an inductor antenna 160 comprising one or more inductor coils 161 to inductively couple energy to the process gas. The inductor antenna 160 has a circular symmetry about a center of the chamber 110 and typically comprises coils having from about 1 to about 20 turns. A suitable inductor antenna 160 provides good inductive flux coupling to the process gas. When the inductor antenna 160 is positioned near the ceiling 115 of the chamber 110, the adjacent portion of the ceiling 115 may be made from a dielectric material, such as silicon dioxide, which is transparent to RF or electromagnetic fields. In one version, the dielectric ceiling 115 is dome shaped and the inductor antenna 160 covers at least a portion of the ceiling 115. An antenna power supply 165 powers the inductor antenna 160, with for example RF power at a frequency of from about 50 KHz to about 60 MHz, and at a power level of from about 100 to about 5000 Watts. An RF match network 167 may also be provided to match impedances.

The gas energizer 150 may also, or alternatively, comprise process electrodes that may be powered by a power supply 157 to energize process gas. The process electrodes may include an electrode that is, or is in, a wall, such as a sidewall 117 or ceiling 115 of the chamber 110 that may be capacitively coupled to another electrode, such as an electrode in the support 130 below the substrate 105. The electrode may comprise a dielectric ceiling 115 that serves as an induction field transmitting window that provides a low impedance to an RF induction field transmitted by the inductor antenna 160 above the ceiling 115. Suitable dielectric materials that can be employed include materials such as aluminum oxide or silicon dioxide. Generally, the electrodes may be electrically biased relative to one another by providing an RF bias voltage. The RF bias voltage may comprise frequencies of about 50 kHz to about 60 MHz, and is preferably about 13.56 MHz, and the power level of the RF bias current is typically from about 50 to about 3000 watts.

The substrate support 130 in the chamber 110 may comprise an electrostatic chuck 170 which comprises a base 172 for supporting a dielectric 174, which comprises a portion 176, which at least partially covers a chucking electrode 178, and which may include a substrate receiving surface 180. The electrode 178 may also be capable of generating an electrostatic charge for electrostatically holding the substrate 105 to the support 130 or electrostatic chuck 170. A DC voltage supply 188 provides the chucking voltage to the electrode 178 through an electrical connector 190. The DC chuck voltage supply 188 typically provides a DC chuck voltage of 250 to 2000 Volts to the electrode 178. The voltage supply 188 can also be controlled to chuck or dechuck the substrate 105. The electrode 178 may also serve as one of the process electrodes discussed above or the base 172 may serve as a process electrode.

The support 130 may comprise one or more conduits extending therethrough to supply heat transfer gas from a heat transfer gas supply to an interface between the surface 180 of the dielectric 174 and the substrate 105. The heat transfer gas, typically helium, promotes heat transfer between the substrate 105 and the support 130 or electrostatic chuck 170. The base 172 may have channels (not shown) through which heat transfer fluid is circulated to heat or cool the substrate 105. The support 130 may also comprise a heating system 182, for example, a resistive heating element 184, through which a current may pass to cause the element to increase in temperature. A heater power supply 186 may be provided to provide a heating voltage to the heating element 184.

In the version shown in FIG. 1, RF energy is applied to the inductor antenna 160 to inductively couple electromagnetic energy to the process gas in the process zone 155 to energize the process gas. The electromagnetic induction energy has magnetic and electric field components that oscillate at the same frequency. The oscillating magnetic field is substantially parallel to the substrate 105 and typically penetrates only a relatively thin depth into the chamber 110 that is close to the excitation source, which is the inductor antenna 160. It is believed that the oscillating electric field components accelerate free electrons and other ionized gas species to sustain an ionized gas plasma. Typically, the electric field is orthogonal to the plane of the substrate 105 and oscillates 90° out of phase with the oscillating magnetic field.

The apparatus 100 may also comprise a magnetic field generator 300 capable of generating a magnetic field in the process zone 155 of the process chamber 110 to controllably shape the plasma to control the distribution of plasma species in the process zone 155. A charged plasma species entering the magnetic field flux is directed along a direction defined by the Lorentz force associated with the magnetic field. Thus, the plasma species may be preferentially directed along certain directions or confined to certain regions in the process zone 155 of the chamber 110 by controlling the magnetic field flux generated in the process zone 155 of the chamber 110.

The magnetic field generator 300 generates a magnetic field in the process zone 155 that preferentially shapes the plasma to compensate for non-uniform etching rates of a substrate 105 in a particular etching process. For example, the magnetic field generator 300 may be adapted to generate a magnetic field in the process zone 155 to shape the plasma to reduce etch rate variations across the substrate 105. In one example, the magnetic field generator 300 generates a magnetic field that is aligned to a chamber axis (not seen) to shape the plasma horizontally across the process zone 155. In another version, the plasma is controllably shaped in the horizontal direction across the substrate 105 to have a higher density near a central portion 106 of the substrate 105 and a lower density toward a peripheral edge 107 of the substrate 105. Because the distribution of plasma species is higher near the substrate's central portion 106 it is processed at higher etching rates than at the peripheral edge 107. Such a magnetic field flux and the resultant plasma distribution shape may be used to compensate for the higher etching rates that may be obtained at the peripheral edge 107 of the substrate 105 relative to its central portion 106, because of, for example, higher temperatures at the peripheral edge 107. Additionally, increasing the plasma density near the substrate 105 reduces the exposure of the surfaces of walls and components in the chamber 110 to the plasma to reduce erosion of these surfaces or reduce deposition of residue on these surfaces. Such a plasma distribution may be formed by generating a magnetic field that is strong near the side walls 117 of the chamber 110 and weak near the center of the process zone 155, thereby deflecting the plasma away from the side walls 117 and increasing the confinement of the plasma in proximity to the center of the substrate 105 in the process zone 155. The strength or shape of the magnetic field may be selected so that the plasma etches the substrate 105 such that the substrate etch rate uniformity (standard deviation of the etch rate divided by the mean etch rate) is less than about 7%, and more preferably less than about 5%, and most preferably less than about 3%.

In one version, the magnetic field generator 300 comprises one or more solenoids 310, 330 disposed about the chamber 110. The solenoids 310, 330 may comprise one or more conductor coils with or without a ferromagnetic core, such as iron, to generate a magnetic field in the process zone 155 when a current is applied thereto. The solenoids 310, 330 may extend at least partially around the chamber 110, such as positioned radially outward from one of the inductor coils. In one example, the solenoids 310, 330 are positioned above the ceiling 115 of the process chamber 110 or above one of the inductor coils, for example by being mounted on or near a housing 350 by a bracket 355, as shown in FIG. 1. In another example, the solenoids 310, 330 may be mounted between one of the inductor coils 161 and the support 130. The housing 350 may house a temperature control unit (not shown) which serves to control the temperature of the ceiling of the process chamber 110. The solenoids 310, 330 may also be powered by a power supply 315 that provides DC or AC power to the solenoids 310, 330. For example the power supply 315 may comprise a DC magnet power source 320 adapted to supply a DC current to the solenoids 310, 330 to generate a magnetic field in the process zone 155.

The magnetic field generator 300 shapes the magnetic field flux formed in the process zone 155 of the chamber 110 to control the shape of the plasma in the process zone 155. The magnetic field flux needed to shape the plasma can be determined empirically by etching a batch of sacrificial or test substrates 105 at varying magnetic field strengths. After etching, the substrates 105 are analyzed to determine the etching rates achieved across the substrate 105. In one version, the selected magnetic field strength is the lowest magnetic field that provides the desired etch rate uniformity of the substrate 105. This selected magnetic field may then be applied during etching of production substrates 105 in the chamber 110. In this manner, the magnetic field strength can be adjusted for a particular process or for different sized substrates 105, such as 200 mm and 300 mm diameter substrates.

The shape of the magnetic field applied to the plasma in the process zone 155 may also be adjusted by the position or current level applied to the solenoids 310, 330. FIG. 1 illustrates a version comprising a first and second solenoids 310, 330, which are powered by a first magnet power source 320 and second magnet power source 325. The first and second solenoids 310, 330 are sized and positioned according to the desired magnetic field to be generated in the chamber 110. In one version, the first solenoid 310 comprises a coil having a radius of about 26 cm and about 114 turns, and the second solenoid 330 comprises a coil having a radius of about 17 cm and about 88 turns. In this version, the first and second solenoids 310, 330 are substantially coplanar. The height of the first and second solenoids 310, 330 from above the surface of the substrate 105 is about 22 cm.

Figure 2:
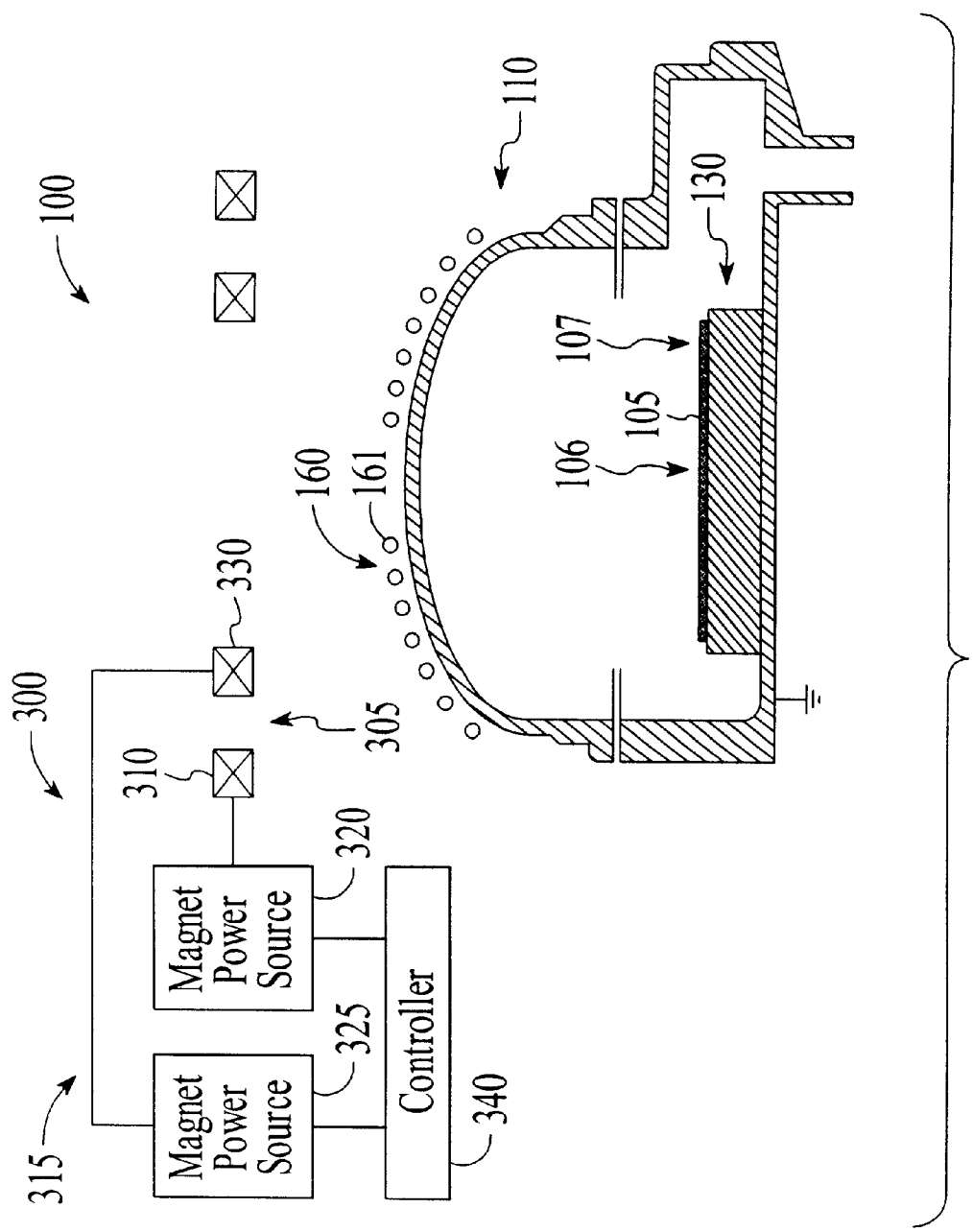
FIG. 2 is a schematic sectional view of another version of the process chamber and magnetic field generator.
Figure 3A:
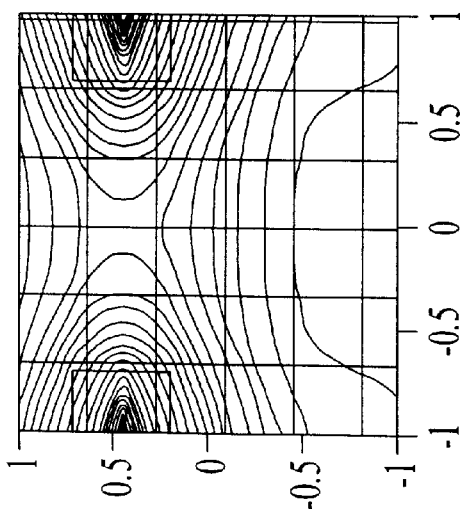
FIGS. 3a–3c are graphical representations of magnetic equipotential lines for differently shaped magnetic fields in a process chamber.
Figure 3B:
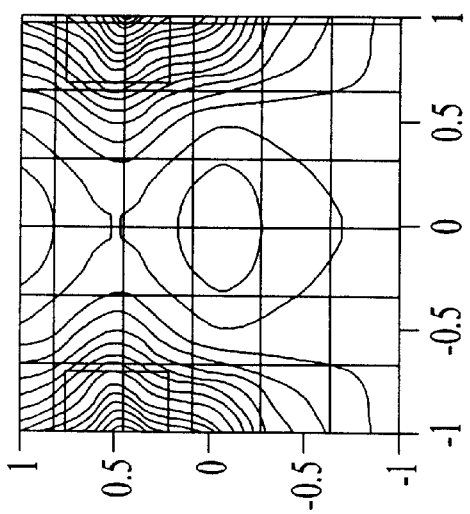
Figure 3C:
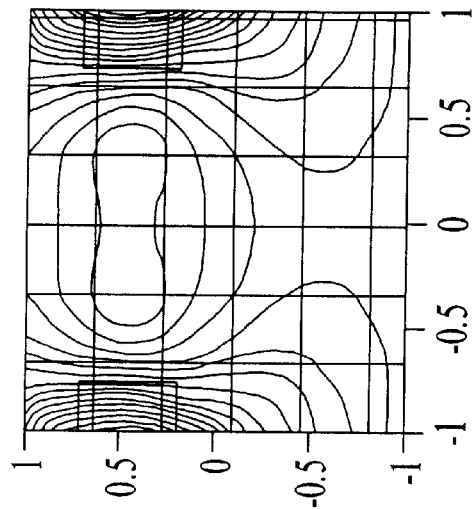

In the version illustrated in FIG. 2, each solenoid 310, 330 is independently powered by a different power source 320, 325. The separate first and second power sources 320, 325 provide more control over the current applied to each solenoid 310, 330. The currents applied to the solenoids 310, 330 may have the same or different values and may be directed in the same or in opposite directions. For example, the current applied to the first solenoid 310 may be in a clockwise direction, while the current simultaneously applied to the second solenoid 330 is in a counterclockwise direction, or vice versa. The independently adjustable solenoids 310, 330 allow for more control of the magnetic field and resultant plasma distribution. For example, FIGS. 3a through 3c represent different shapes of magnetic fields that can be generated by varying the current applied to the second solenoid 330 with the first solenoid 310 carrying a current in the opposite direction. In these figures, the axes are normalized with the horizontal axis representing the internal diameter of the second solenoid 330 and with the substrate 105 being at the bottom of the vertical axis. These figures show simulated patterns of magnetic equipotential lines when the first solenoid 310 is supplied with a current of about 15 Amps and the second solenoid 330 provided with 8 Amps in FIG. 3a, 12 Amps in FIG. 3b, and 15 Amps in FIG. 3c.

Figure 4:
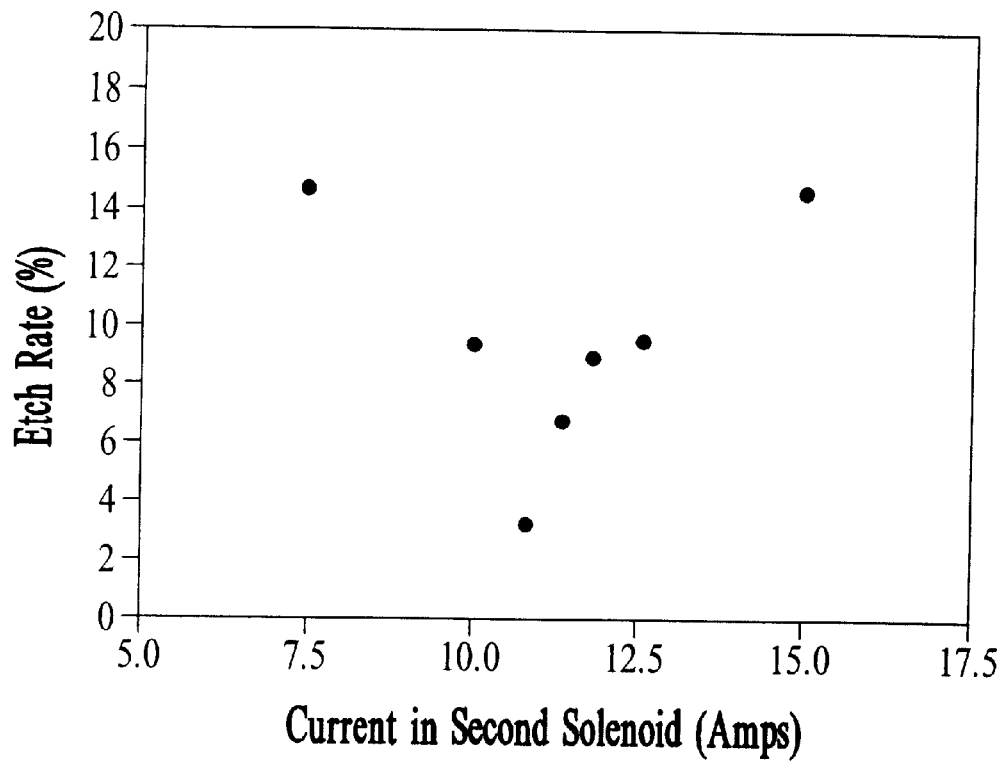
FIG. 4 is a graph showing etch rate uniformity across a substrate as a function of a current applied to the magnetic field generator.

Examples were also performed to determine etch rate uniformity and etch rates for different applied magnetic fields in a process chamber 110 as shown in FIG. 1. For example, FIG. 4 shows the etch rate uniformity of a substrate 105 for increasing current applied to the second solenoid 330 with the first solenoid 310 carrying a current of 15 Amps in the opposite direction. In this example, a silicon oxide material on the substrate 105 was etched using a process gas comprising $Cl_2$, $BCl_3$, and $N_2$. FIG. 4 shows that the etch rate of the substrate 105 is most uniform when the ratio of the first solenoid current to the second solenoid current is less than about 2:1, and may be at least about 1:1, and more preferably may be from about 1.6:1 to about 1.1:1. This range corresponds to a second solenoid current of from about 9 Amps to about 13 Amps. In the configuration tested, the etch rate was most uniform at a second solenoid current of about 11 Amps, or at a ratio of about 1.4:1. The relatively high etch rate standard deviation for applied currents less than about 9 Amps is the result of higher etch rate at the edge 107 of the substrate 105 than at the center 106 of the substrate 105, and the relatively high etch rate standard deviation for applied currents above about 13 Amps is the result of higher etch rate at the center 106 than at the edge 107.

Figure 5:
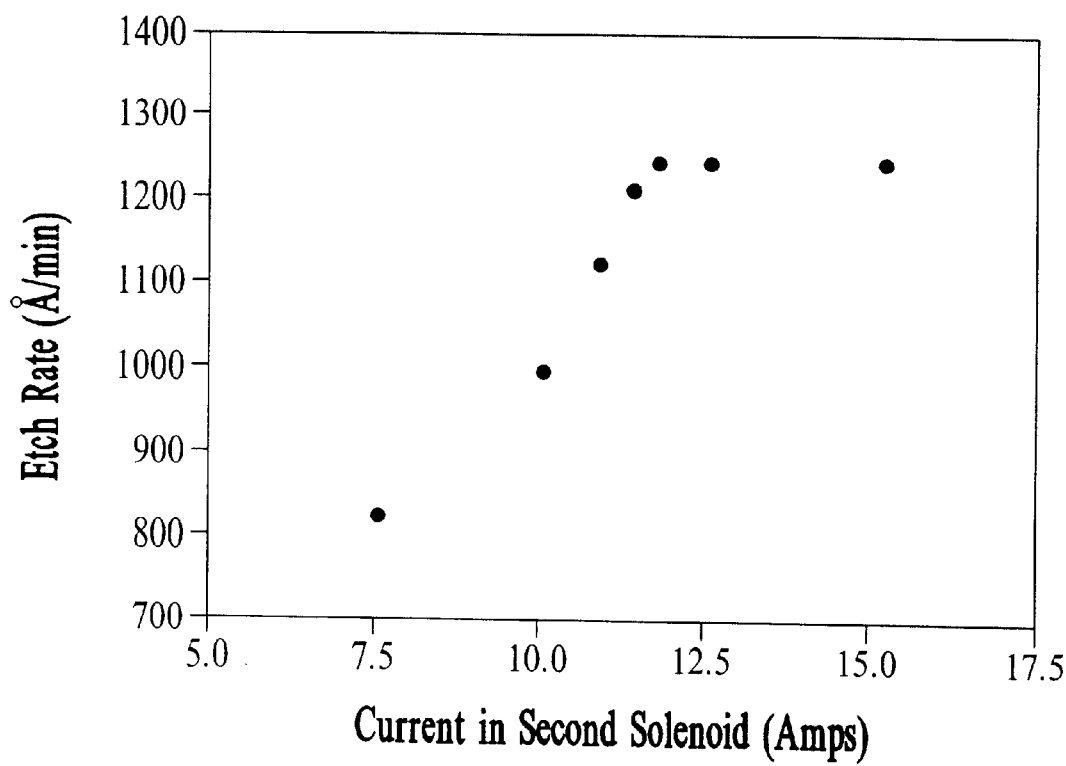
FIG. 5 is a graph showing the etch rate for increasing current applied to the magnetic field generator.

FIG. 5 shows the etch rate for etching silicon dioxide material on a substrate 105 again as a function of applied current to the second solenoid 330. In this example, the etch rate significantly improves when currents greater than about 10 Amps are applied to the second solenoid 330 or at ratios of first solenoid current to oppositely directed second solenoid current having a value less than about 1.5:1.

Accordingly, a high and uniform etch rate may be achieved with a first solenoid current of 15 Amps and a second solenoid current of from about 9 Amps to about 13 Amps, and more preferably from about 11 Amps to about 12 Amps. These values are not intended to limit the invention but to demonstrate the variability in etch rate and etch rate uniformity that may be achieved by having an adjustable magnetic field. The etch rate for this configuration with no current in the coils is about 1160 angstroms/minute and the etch rate uniformity is about 7%.

Figure 6:
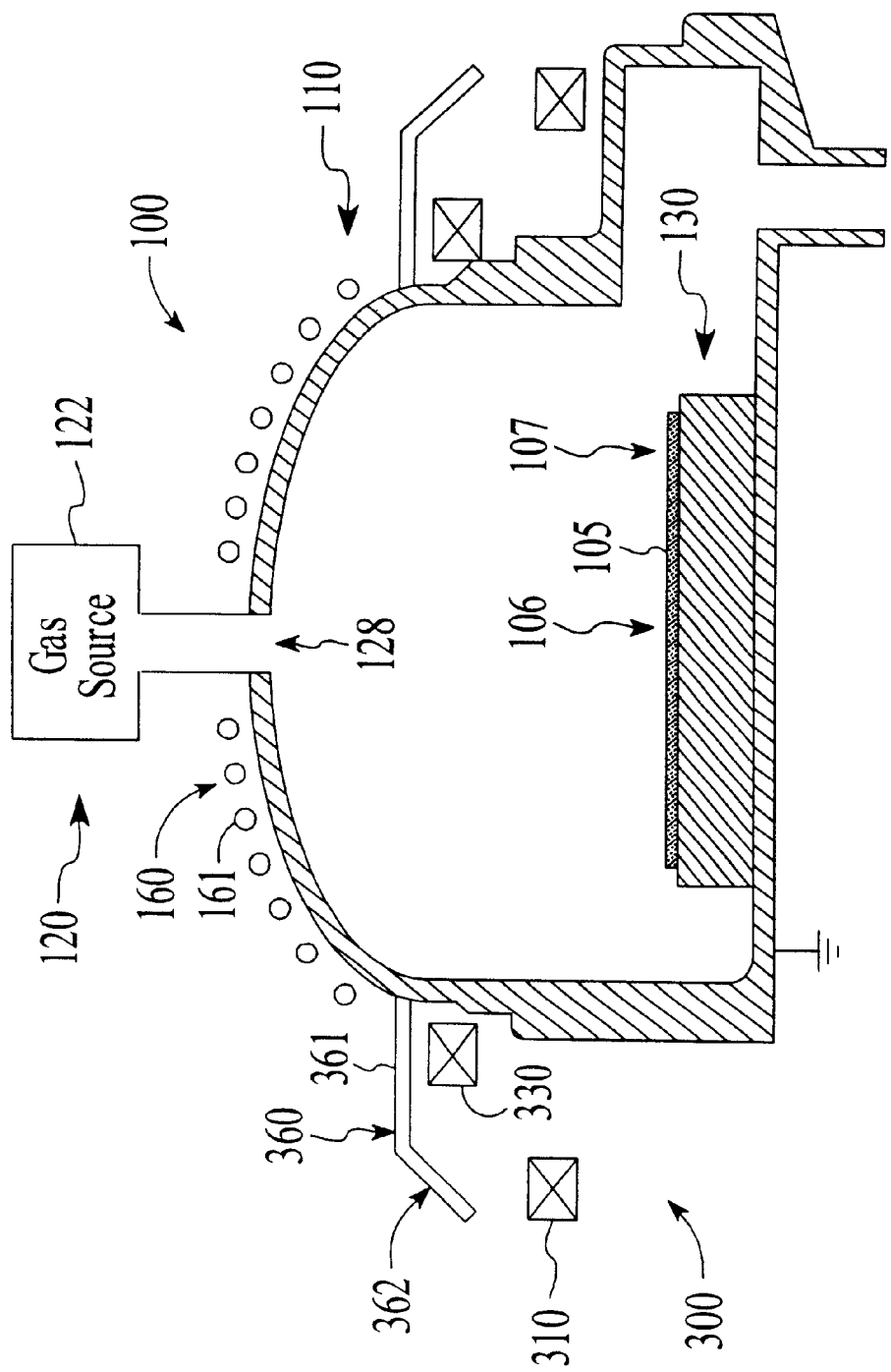
FIG. 6 is a schematic sectional view of another version of a process chamber and magnetic field generator.

Another version of the process chamber 110 and magnetic field generator 300 according to the present invention is shown in FIG. 6. In this version, the first solenoid 310 and the second solenoid 330 are offset from one another both radially and vertically. Additionally, in the version shown, the position of the solenoids 310, 330 is generally lowered to a position nearer the plane of the substrate 105. For example, in one version, the first solenoid 310 may be positioned about 2 cm above the plane of the substrate 105, and the second solenoid 330 may be positioned about 5 cm above the plane of the substrate 105. Also, the process gas supply 120 comprises a showerhead gas outlet 128 that introduces the process gas into the chamber 110 from above the substrate 105, such as to improve the gas flow uniformity across the substrate 105.

The process chamber 110 may also comprise a magnetic shield 360 positioned, for example, about the first and second solenoids 310, 330 of the magnetic field generator 300 to shield the magnetic fields generated by the solenoids 310, 330. The magnetic shield 360 may be shaped and sized to reduce propagation of the stray magnetic field outside the chamber 110. The magnetic shield 360 may also be adapted to direct magnetic field generated by the solenoids 310, 330 to specific regions in the chamber 110. This allows the solenoids 310, 330 to be operated to provide different magnetic field strengths in different regions of the process chamber 110, for example, to provide different field strengths in the gas energizing or gas distribution regions, or different field strengths across different regions of the substrate 105. In one embodiment, as illustrated in FIG. 6, the magnetic shield 360 comprises a magnetically permeable material that is shaped as a circumferential skirt 361 extending around and above the solenoids 310, 330 and which has a downwardly angled lip 362 about the perimeter of the solenoids 310, 330. The shield 360 reduces the propagation of stray magnetic fields generated by the solenoids 310, 330 to the external environment.

Figure 7B:
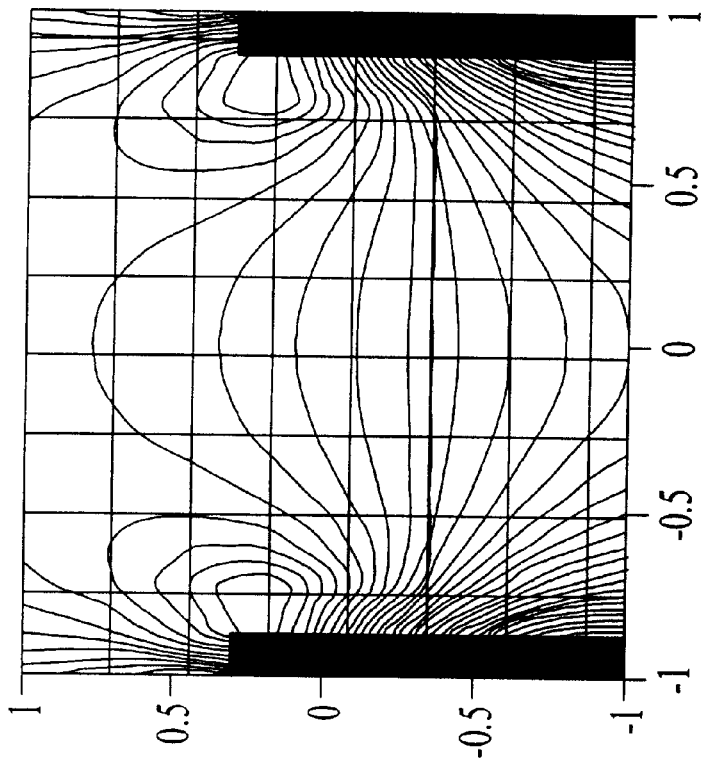
FIGS. 7a–7d are graphic representations of magnetic equipotential lines for differently shaped magnetic fields in a process chamber having the magnetic field generator of FIG. 6.
Figure 7A:
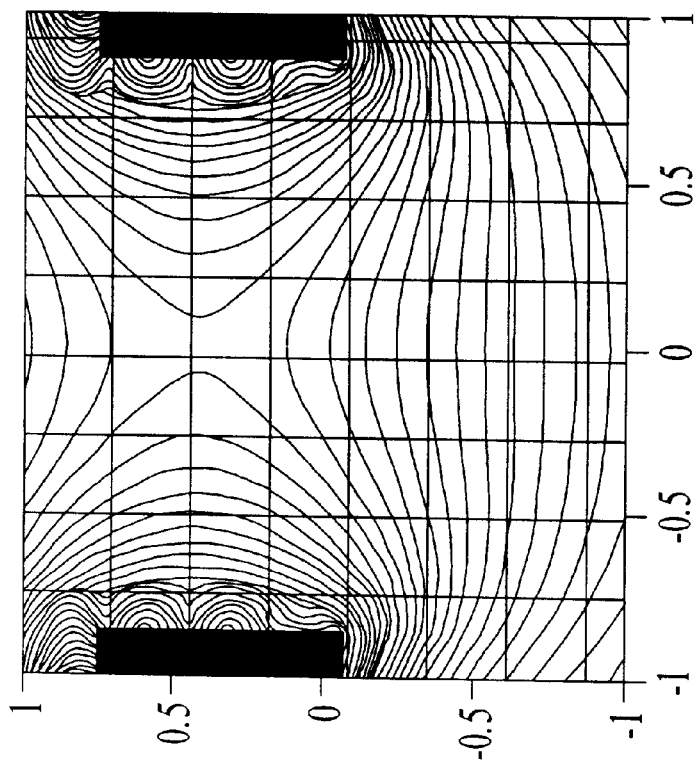
Figure 7C:
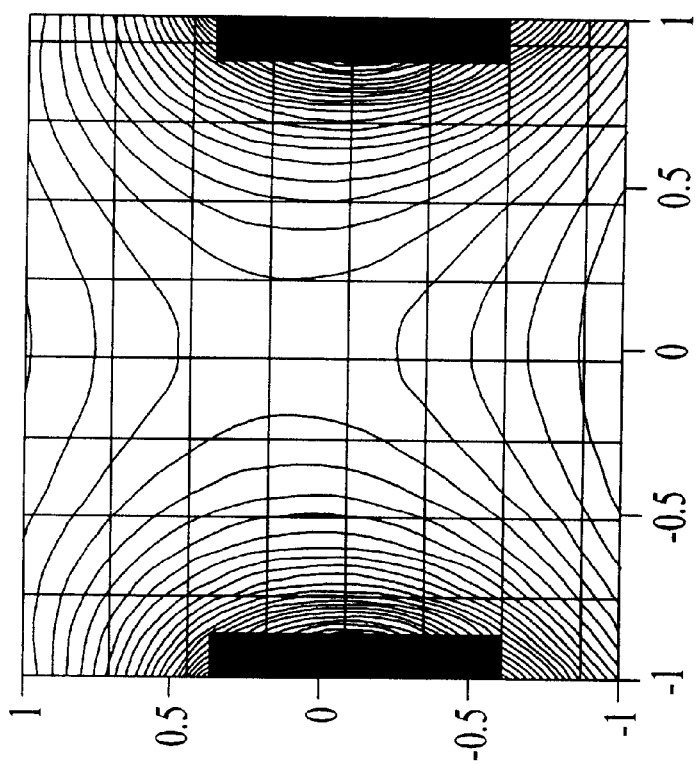
Figure 7D:
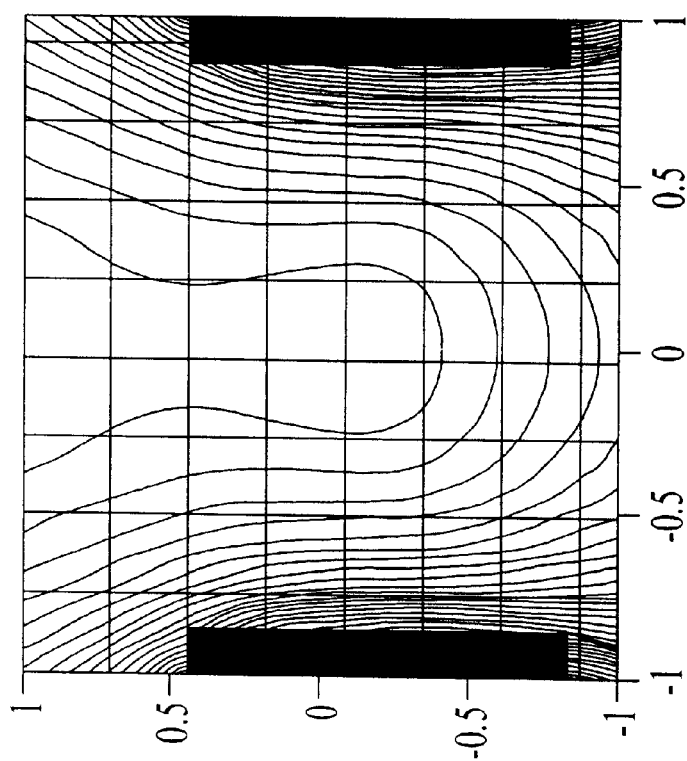

FIGS. 7a through 7d represent differently shaped magnetic fields that can be generated by varying the current supplied to the first solenoid 310 and to the second solenoid 330 in the opposite direction. In these figures, the axes are normalized with the horizontal axis representing the internal diameter of the second solenoid 330 and with the vertical axis representing the distance between the second solenoid 330 and the substrate 105 with the first solenoid 310 being intermediately positioned. The figures show a simulated pattern of magnetic equipotential lines. In FIG. 7a, the ratio of the current applied to the first solenoid 310 to the current applied to the second solenoid 330 is 1:1; and in FIGS. 7b through 7d, the ratios are 1.5:1, 1.2:1, and 0.8:1, respectively.

Figure 8A:
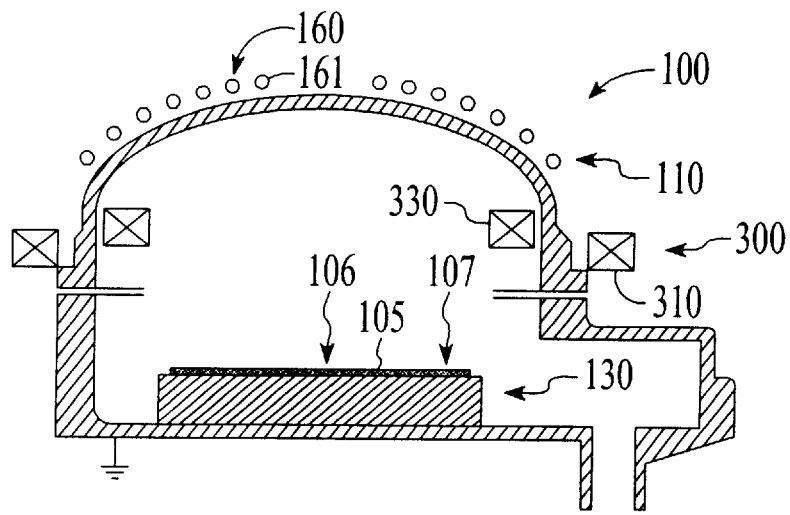
FIGS. 8a–8c are schematic sectional side views of other versions of process chambers and magnetic field generators.
Figure 8B:
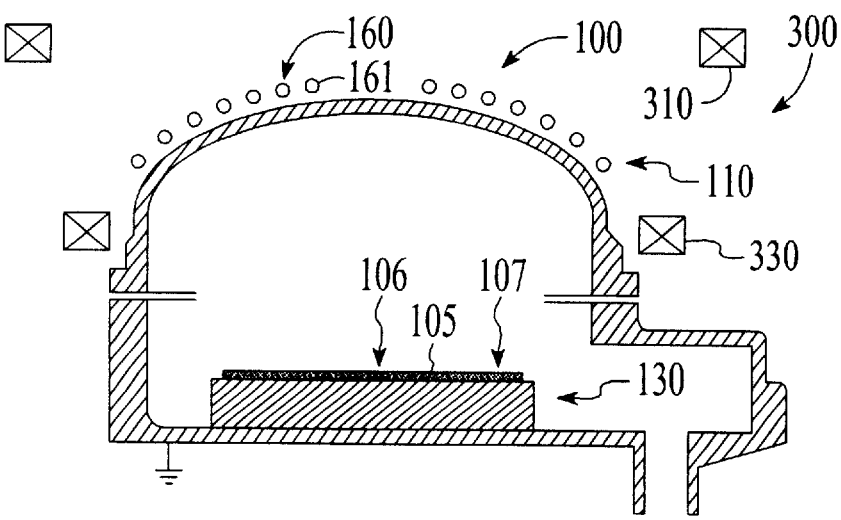
Figure 8C:
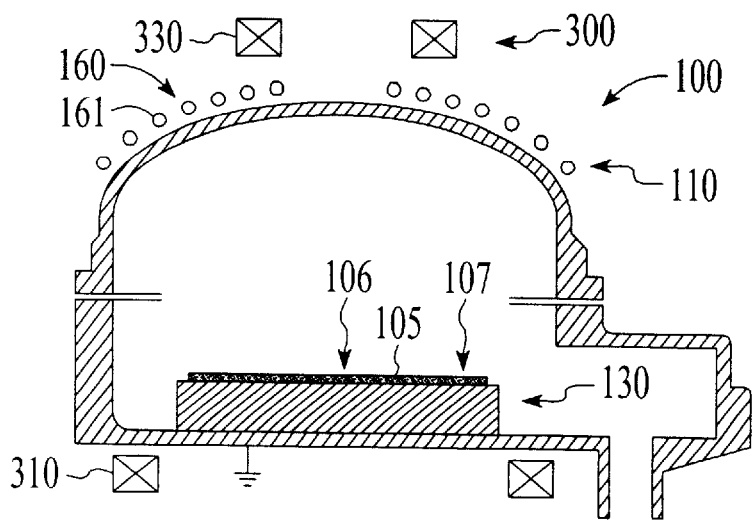

FIGS. 8a through 8c show alternative configurations of the magnetic field generator 300 that provide differently shaped magnetic fields and plasmas. The first solenoid 310 and the second solenoid 330 may also be movable in the vertical directions to adjust the positioning thereof.

The controller 340 controls operation of the apparatus 100 during processing of the substrate 105. For example, in an etching process, the controller 340 operates a robot (not shown) to transport a substrate 105 into the chamber 110 and place the substrate 105 on the support 130. The controller 340 operates the pump 138 to maintain the process zone 155 at a low pressure. The controller 340 then controls the flow control valves 126 of the gas supply 120 to introduce a desired composition of process gas, for example, etchant gas that is capable of etching the substrate 105. The controller 340 powers the inductor coil to generate a plasma from the etchant gas. The controller 340 also controls the power supply 315 to power the magnetic filed generator 300 to shape the magnetic field in the process zone 155 to improve the etch rate variations across the substrate 105. For example, the controller may control the power supply to power the first and second solenoids 310, 330 to generate a magnetic field in the process zone 155 to shape the plasma in the process zone 155 to reduce etch rate variations across the substrate 105. In one version, the controller 340 may be adapted to control the power supply 315 to power the first and second solenoids 310, 330 to generate a magnetic field in the process zone 155 that is aligned to a chamber axis (not seen) thereby shaping the plasma horizontally across the process zone 155.

Figure 9:
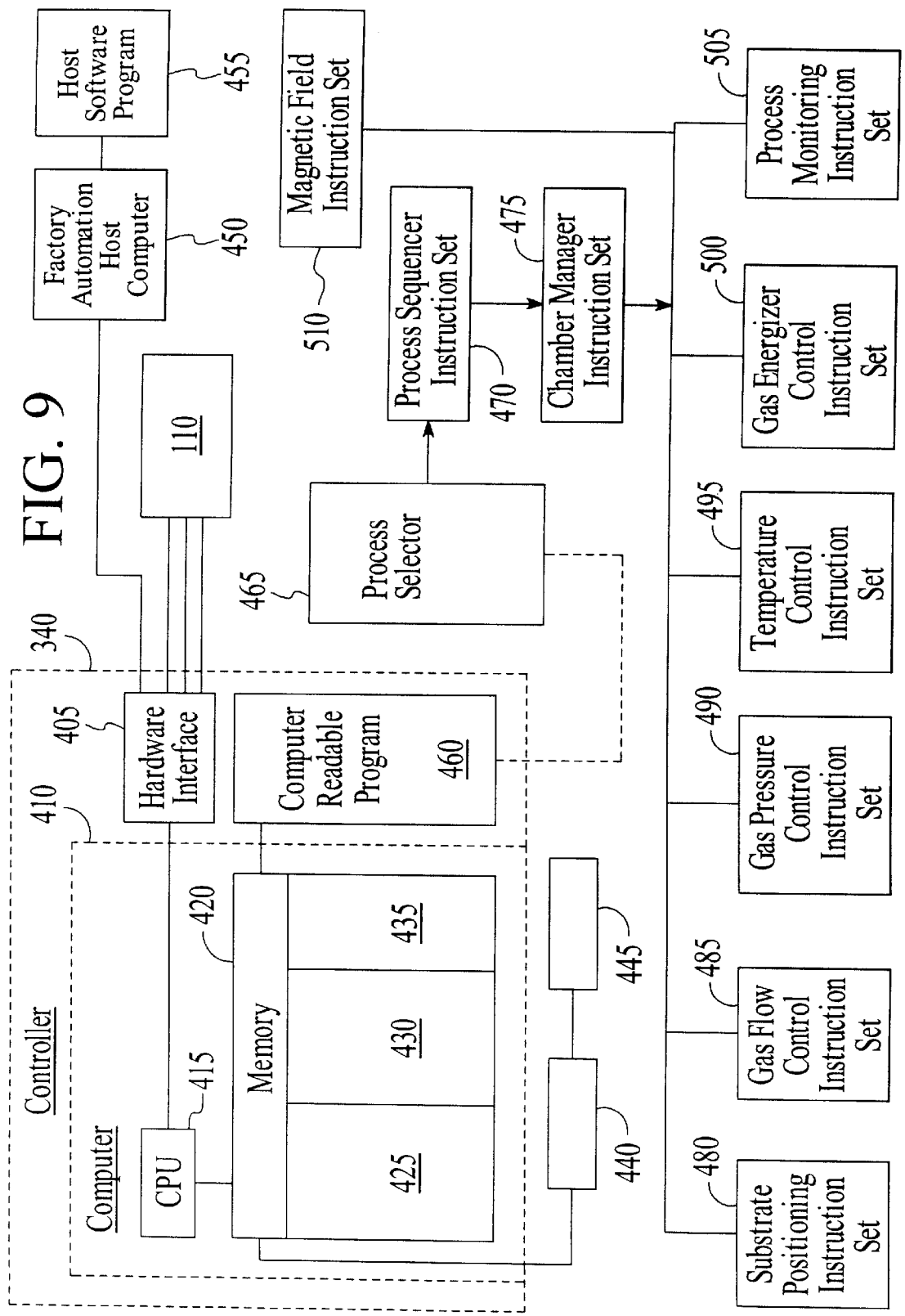
FIG. 9 is a block diagram of a controller according to the present invention.

The controller 340 generally comprises a computer 410 comprising a central processing unit (CPU) 415, such as for example a Pentium Processor commercially available from Intel Corporation, Santa Clara, Calif., that is coupled to a memory 420 and peripheral computer components, as shown in FIG. 9. In one version, the memory 420 may include a removable storage medium 425, such as for example a CD or floppy drive, a non-removable storage medium 430, such as for example a hard drive, and random access memory 435. The controller 340 may further comprise a hardware interface 405 comprising a plurality of interface cards including, for example, input and output boards, and motor controller boards. An operator operates the controller 340 by a display 440 and a light pen 445 that detects light emitted by the display 440. To select a particular screen or function, the operator touches a designated area of a screen on the display 440 and pushes a button on the light pen 445. Typically, the area touched changes color, or a new menu is displayed, confirming communication between the user and the controller 340. Alternatively, a keyboard and/or mouse or any other interface device may be employed.

The data signals received by and/or evaluated by the controller 340 may be sent to a factory automation host computer 450. The factory automation host computer 450 may comprise a host software program 455 that evaluates data from several systems, platforms or chambers 110, and for batches of substrates 105 or over an extended period of time, to identify statistical process control parameters of (i) the processes conducted on the substrates 105, (ii) a property that may vary in a statistical relationship across a single substrate 105, or (iii) a property that may vary in a statistical relationship across a batch of substrates 105. The host software program 455 may also use the data for ongoing in-situ process evaluations or for the control of other process parameters. A suitable host software program comprises a WORKSTREAM™ software program available from aforementioned Applied Materials. The factory automation host computer 450 may be further adapted to provide instruction signals to (i) remove particular substrates 105 from the processing sequence, for example, if a substrate property is inadequate or does not fall within a statistically determined range of values, or if a process parameter deviates from an acceptable range; (ii) end processing in a particular chamber 110, or (iii) adjust process conditions upon a determination of an unsuitable property of the substrate 105 or process parameter. The factory automation host computer 450 may also provide the instruction signal at the beginning or end of processing of the substrate 105 in response to evaluation of the data by the host software program 455.

In one version the controller 340 comprises a computer-readable program 460 that may be stored in the memory 420, for example, in the non-removable storage medium 430 or on the removable storage medium 425. The computer-readable program 460 generally comprises process control software comprising program code to operate the chamber 110 and its components, process monitoring software to monitor the processes being performed in the chamber 110, safety systems software, and other control software. The computer-readable program 460 may be written in any conventional computer-readable programming language, such as for example, assembly language, C++, Pascal, or Fortran. Suitable program code is entered into a single file, or multiple files, using a conventional text editor and stored or embodied in computer-usable medium of the memory 420. If the entered code text is in a high level language, the code is compiled, and the resultant compiler code is then linked with an object code of precompiled library routines. To execute the linked, compiled object code, the user invokes the object code, causing the CPU 415 to read and execute the code to perform the tasks identified in the program.

An embodiment of a computer-readable program 460 according to the present invention is shown in FIG. 9. Using the light pen 445, for example, a user enters a process set and chamber number into the computer-readable program 460 in response to menus or screens displayed on the display 440, such as a CRT terminal, that make up a process selector 465. The computer readable program 460 includes program code to control the substrate position, gas flow, gas pressure, temperature, RF power levels, magnetic field shape or strength, and other parameters of a particular process, as well as code to monitor the chamber process. The process sets are predetermined groups of process parameters necessary to carry out specified processes. The process parameters are process conditions, including without limitations, gas composition, gas flow rates, temperature, pressure, gas energizer settings such as RF or microwave power levels, magnetic field generation, heat transfer gas pressure, and wall temperature.

The process sequencer instruction set 470 comprises program code to accept a chamber type and set of process parameters from the computer readable program 460 or the process selector 465 and to control its operation. The sequencer program 470 initiates execution of the process set by passing the particular process parameters to a chamber manager instruction set 475 that controls multiple processing tasks in the process chamber 110. The chamber manager instruction set 475 may include, for example, a substrate positioning instruction set 480, a gas flow control instruction set 485, a gas pressure control instruction set 490, a temperature control instruction set 495, a gas energizer control instruction set 500, a process monitoring instruction set 505, and a magnetic field generation instruction set 510. The substrate positioning instruction set 480 may comprise program code for controlling chamber components that are used to load the substrate 105 onto the support 130 and optionally, to lift the substrate 105 to a desired height in the chamber 110. The gas flow control instruction set 485 may comprise program code for controlling the flow rates of different constituents of the process gas. The gas flow control instruction set 485 regulates the opening size of the gas flow control valves 126 to obtain the desired gas flow rate into the chamber 110. The gas pressure control instruction set 490 comprises program code for controlling the pressure in the chamber 110 by regulating open/close position of the throttle valve 136. The temperature control instruction set 495 may comprise, for example, program code for controlling the temperature of the substrate 105 during processing. For example, the temperature control instruction set 495 may control the heater 182 and/or may control the flow of heat transfer fluid through the support 130. The gas energizer control instruction set 500 comprises program code for setting, for example, the RF power level applied to the inductor antenna 160 by the antenna power supply 165. The process monitoring instruction set 505 may comprise code for monitoring the process in the chamber 110, and may comprise endpoint determination program code.

The magnetic field generation instruction set 510 comprises program code to control the operation of the magnetic field generator 300. The magnetic field instruction set 510 comprises program code to control the magnetic power supply 315 to power the first and second solenoids 310, 330. The magnetic field instruction set 510 sets the currents applied by magnet power supply 315 to the first and second solenoids 310, 330 to shape the resultant magnetic field to the desired configuration in the process zone 155. A predetermined magnetic field strength or shape for a particular magnetic field generator configuration can also be stored and applied by the magnetic field instruction set 510. The magnetic field to be applied in the process zone 155 may be selected from a set of magnetic field shapes or may be input by a user. The magnetic field instruction set 510 may also comprise program code enabling a magnetic field shape test to be performed on one or more test substrates. For example, in one version, for a particular magnet configuration, a first current may be applied to a first solenoid 310 and the magnetic field instruction set can instruct a second current to be applied to a second solenoid 330. The first and second currents applied to the solenoids 310, 330 may, optionally, also be varied. After several iterations, a current pattern corresponding to a desired magnetic field shape may be selected for a particular process with a particular magnet configuration. The selected shape may be stored and used during processing of substrates 105. For example, a desired magnetic field shape may be selected which provides a uniform distribution of process gas across the surface of a substrate 105 as discussed above.

While described as separate instruction sets for performing a set of tasks, it should be understood that each of these instruction sets can be integrated with one another, or the tasks of one set of program code integrated with the tasks of another to perform the desired set of tasks. Thus, the controller 340 and the computer program code described herein should not be limited to the specific version of the functional routines described herein; and any other set of routines or merged program code that perform equivalent sets of functions are also in the scope of the present invention.

Although the present invention has been described in considerable detail with regard to certain preferred versions thereof, other versions are possible. For example, the magnetic field generator may have other arrangements. Also, the apparatus of the present invention can be used in other processes, such as physical vapor deposition and chemical vapor deposition processes. Therefore, the appended claims should not be limited to the description of the preferred versions contained herein.

What is claimed is:

1. A substrate etching chamber comprising:
   a substrate support to support a substrate in a process zone;
   a gas supply to introduce a process gas into the process zone;
   an inductor antenna to inductively couple energy to the process gas to form a plasma of the process gas in the process zone;
   a magnetic field generator to generate a magnetic field in the process zone, the magnetic field generator comprising first and second solenoids above a ceiling of the chamber, the second solenoid being radially offset from the first solenoid, and a power supply to power the solenoids;
   a controller adapted to control the power supply of the magnetic field generator to pass a first current through the first solenoid and pass a second current through the second solenoid, the second current being in the opposite direction of the first current; and
   an exhaust to exhaust the process gas.

2. A chamber according to claim 1 wherein the controller is adapted to control the power supply to generate a magnetic field in the process zone to shape the plasma to reduce etch rate variations across the substrate.

3. A chamber according to claim 2 wherein the controller is adapted to control the power supply to generate a magnetic field in the process zone to shape the plasma to provide a substrate etch rate uniformity that is less than about 7%.

4. A chamber according to claim 1 wherein the ratio of the first current to the second current is less than about 2:1.

5. A chamber according to claim 4 wherein the ratio is at least about 1:1.

6. A chamber according to claim 1 wherein the first and second solenoids are substantially coplanar.

7. A chamber according to claim 1 wherein the first and second solenoids are vertically or horizontally offset from one another.

8. A chamber according to claim 1 wherein the first and second solenoids are positioned radially outward from the inductor antenna.

9. A chamber according to claim 1 comprising a magnetic shield about the first and second solenoids.

10. A chamber according to claim 1 wherein the first and second solenoids are coplanar.

11. A chamber according to claim 1 wherein the first and second solenoids are not coplanar.

12. A substrate etching method comprising:
   (a) placing a substrate in a chamber defining a process zone;
   (b) introducing a process gas into the process zone;
   (c) inductively coupling energy to the process gas to form a plasma in the process zone;
   (d) generating a magnetic field in the process zone by providing a first current to a first solenoid above a ceiling of the chamber and a second current to a second solenoid above the ceiling of the chamber that is radially offset from the first solenoid, the first current being in the opposite direction to the second current; and
   (e) exhausting the process gas from the process zone.

13. A method according to claim 12 comprising generating a magnetic field to shape the plasma to reduce etch rate variations across the substrate.

14. A method according to claim 13 comprising generating a magnetic field to shape the plasma to provide a substrate etch rate uniformity that is less than about 7%.

15. A method according to claim 12 wherein the ratio of the first current to the second current is less than about 2:1.

16. A method according to claim 15 wherein the ratio is at least about 1:1.

17. A method according to claim 12 wherein (d) comprises generating a magnetic field in the process zone by providing the first current to the first solenoid and the second current to the second solenoid, the first and second solenoids being coplanar.

18. A method according to claim 12 wherein (d) comprises generating a magnetic field in the process zone by providing the first current to the first solenoid and the second current to the second solenoid, the first and second solenoids being non-coplanar.

19. A substrate etching chamber comprising:
   a substrate support to support a substrate in a process zone;
   a gas supply to introduce a process gas into the process zone;
   a gas energizer comprising a process electrode to couple energy to the process gas to form a plasma of the process gas in the process zone and an RF power supply to provide an RF voltage to the process electrode;
   a magnetic field generator to generate a controllable magnetic field in the process zone, the magnetic field generator comprising first and second solenoids disposed above a ceiling of the chamber and a DC power supply to pass direct current through the first and second solenoids in opposite directions; and
   an exhaust to exhaust the process gas.

20. A chamber according to claim 19 comprising a controller adapted to control the DC power supply to provide current to the first and second solenoids to generate a magnetic field in the process zone that shapes the plasma in the process zone to reduce etch rate variations across the substrate.

21. A chamber according to claim 19 wherein the controller is adapted to control the DC power supply to provide a first current to the first solenoid and a second current to the second solenoid.

22. A chamber according to claim 21 wherein the first and second currents are in opposite directions.

23. A chamber according to claim 21 wherein the ratio of the first current to the second current is less than about 2:1.

24. A chamber according to claim 23 wherein the ratio is at least about 1:1.

25. A chamber according to claim 19 wherein the first and second solenoids are substantially coplanar.

26. A chamber according to claim 19 wherein the first and second solenoids are positioned radially outward from the inductor coil.

27. A chamber according to claim 19 comprising a magnetic shield about the first and second solenoids.

28. A chamber according to claim 19 wherein the first and second solenoids are coplanar.

29. A chamber according to claim 19 wherein the first and second solenoids are not coplanar.

30. A chamber according to claim 19 wherein the controller is adapted to control the DC power supply to generate a magnetic field to shape the plasma in the process zone to provide a substrate etch rate uniformity that is less than about 7%.

31. A substrate etching method comprising:
   (a) placing a substrate in a chamber defining a process zone;
   (b) introducing a process gas into the process zone;

(c) coupling energy to the process gas to form a plasma in the process zone by providing an RF current voltage to a process electrode;

(d) generating a magnetic field in the process zone by providing a first direct current to a first solenoid above a ceiling of the chamber and a second direct current to a second solenoid above the ceiling of the chamber that is radially offset from the first solenoid, the first and second direct currents being in opposite directions; and (e) exhausting the process gas from the process zone.

32. A method according to claim 31 comprising generating a magnetic field to shape the plasma to reduce etch rate variations across the substrate.

33. A method according to claim 32 comprising generating a magnetic field to shape the plasma to provide a substrate etch rate uniformity that is less than about 7%.

34. A method according to claim 31 comprising generating the magnetic field by passing a first current through the first solenoid and a second current through the second solenoid.

35. A method according to claim 34 wherein the ratio of the first current to the second current is less than about 2:1.

36. A method according to claim 35 wherein the ratio is at least about 1:1.

37. A method according to claim 31 wherein (d) comprises generating a magnetic field in the process zone by providing the first direct current to the first solenoid and the second direct current to the second solenoid, the first and second solenoids being coplanar.

38. A method according to claim 31 wherein (d) comprises generating a magnetic field in the process zone by providing the first direct current to the first solenoid and the second direct current to the second solenoid, the first and second solenoids being non-coplanar.

39. A substrate etching chamber comprising:

a substrate support to support a substrate in a process zone;

a gas supply to introduce a process gas into the process zone;

a gas energizer comprising a process electrode to couple energy to the process gas to form a plasma of the process gas in the process zone and an RF power supply to provide an RF voltage to the process electrode;

a magnetic field generator to generate a controllable magnetic field in the process zone, the magnetic field generator comprising first and second solenoids that are non-coplanar and disposed above a ceiling of the chamber, and a DC power supply to pass direct current through the first and second solenoids in opposite directions; and an exhaust to exhaust the process gas.

* * * * *